(12) United States Patent
Ellsworth, Jr. et al.

(10) Patent No.: US 6,301,097 B1
(45) Date of Patent: Oct. 9, 2001

(54) INFLATABLE SEALING SYSTEM FOR LOW TEMPERATURE ELECTRONIC MODULE

(75) Inventors: Michael J. Ellsworth, Jr., Lagrangeville; Robert E. Simons, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/360,727

(22) Filed: Jul. 27, 1999

(51) Int. Cl.[7] ........................................ H05K 5/00
(52) U.S. Cl. ................ 361/679; 165/46; 174/17.05; 174/52.4
(58) Field of Search ................ 165/46, 104.19; 174/17.05, 17.06, 52.3, 52.4; 361/688–689, 600, 679, 698–699, 704, 707, 712–713, 715

(56) References Cited

U.S. PATENT DOCUMENTS

| | | | |
|---|---|---|---|
| 4,331,830 | 5/1982 | Conway et al. | 174/16 R |
| 5,208,728 * | 5/1993 | Schirmer | 174/52.3 |
| 5,640,303 * | 6/1997 | Hooley | 361/699 |
| 5,801,452 | 9/1998 | Farnworth et al. | 257/797 |

OTHER PUBLICATIONS

Hultmark et al, "Thermal Enhancement of Modules" IBM Technical Disclosure Bulletin, vol. 19, No. 8, Jan. 1977, p. 3127, 361/699.*

R. Baker and J. Mosley, "Inflatable Internal Computer Structure", IBM Technical Disclosure Bulletin, vol. 39, No. 1, (Jan. 1996), pp. 309–312.

* cited by examiner

Primary Examiner—Gregory Thompson
(74) Attorney, Agent, or Firm—Lily Neff, Esq.; Heslin Rothenberg Farley & Mesiti P.C.; Kevin P. Radigan, Esq.

(57) ABSTRACT

An inflatable sealing system and method are provided for a low temperature electronic device such as a cooled multi-chip integrated circuit module. The inflatable sealing system includes a flexible bladder configured to engage at least one surface of the low temperature electronic module. Thermal insulation is disposed within the flexible bladder and a retention cover is provided to hold the flexible bladder against the electronic module. When disposed on a printed circuit board, the electronic module and printed circuit board can be surrounded by one or more inflatable bladders to prevent air from reaching multiple surfaces of the device.

33 Claims, 2 Drawing Sheets

INFLATABLE SEALING SYSTEM FOR LOW TEMPERATURE ELECTRONIC MODULE

TECHNICAL FIELD

This invention generally relates to electronic modules, and more specifically, to a thermally insulating, inflatable, vapor-proof sealing system and method for a low temperature electronic module such as a cooled multichip integrated circuit module.

BACKGROUND OF THE INVENTION

A wide variety of electronic devices exist in the art. These electronic devices may comprise packaged integrated circuit chips, or bare chips which are unpackaged. Further, multiple integrated circuit chips can be integrated into a single multichip module. Any type of circuitry can be integrated in to the chips, such as digital logic circuitry or memory circuitry or analog circuitry. Also, the circuitry in the chips can be comprised of any type of transistors, such as field effect transistors or bipolar transistors.

One reason for trying to lower the temperature of an electronic module is that its operation may be temperature dependent. For example, a chip comprised of complementary field effect transistors (CMOS transistors) typically increases its speed of operation by approximately 0.3% per ° C. drop in chip temperature.

Thus, in order to increase the performance of CMOS based computers, it is advantageous to reduce the operating temperature of the chips substantially. In doing so, however, applicants have discovered that in reducing surfaces of the module below a room air dew point temperature, water vapor will condense on the exposed surfaces. Similarly, the temperature of the air in the vicinity of the module will decrease because of a cooling effect of the cold air surfaces nearby. This will result in an increase in the relative humidity of the air near the module and could adversely effect device reliability. Therefore, there exists a need in the art for a thermally insulating, vapor-proof sealing system for a low temperature electronic module.

DISCLOSURE OF THE INVENTION

To briefly summarize, the present invention comprises in one aspect a sealing system for an electronic device. The sealing system includes a flexible bladder configured to at least partially surround the electronic device, with thermal insulation disposed within the flexible bladder. A retention cover is provided and configured to hold the flexible bladder against the electronic device.

In another aspect, an electronic device assembly is provided which includes a cooled electronic device and a sealing system. The sealing system includes a flexible bladder configured to at least partially surround the electronic device, with thermal insulation being disposed within the flexible bladder. A retention cover is provided and configured to hold the flexible bladder against the cooled electronic device.

In still another aspect, an electronic device assembly is provided which includes an electronic module and a cold plate thermally coupled to a planar main surface of the electronic module. At least one of an inflatable bladder or a pressurized bladder is provided which is configured to conformally overlay multiple surfaces of the electronic module and the cold plate to prevent air from reaching the multiple surfaces and thereby prevent condensation from forming thereon.

In a further aspect, a method for fabricating an electronic device is disclosed which includes: providing an electronic module; providing a flexible bladder configured to at least partially surround the electronic module, the flexible bladder having thermal insulation disposed therein; and applying a retention cover to the flexible bladder and electronic module to hold the flexible bladder against the electronic module.

In a yet further aspect, a method for fabricating an electronic device assembly is provided which includes: providing an electronic module; providing a cold plate and thermally coupling the cold plate to a planar main surface of the electronic module; and providing at least one of an inflatable bladder or a pressurized bladder configured to conformally engage multiple surfaces of the electronic module and cold plate to prevent air from reaching the multiple surfaces and thereby prevent condensation from forming thereon.

To restate, provided herein is a thermally insulating, inflatable, vapor-proof sealing system and method for a low temperature electronic module such as a multichip module comprised, for example, of CMOS-based integrated circuit chips. The low temperature electronic module is cooled in one example by a refrigeration cold plate. A flexible, inflatable bladder is configured to at least partially surround the low temperature electronic module and when inflated conforms to the surfaces of the module thereby preventing moisture-laden air (i.e., water vapor) from contacting the surfaces of the module. In addition to preventing condensation from forming on the surfaces, the inflatable bladder is preferably filled with thermal insulation, such as a plurality of hollow insulating spheres, which minimize the parasitic heat load on the module. The thermal insulation breaks up any pattern of natural heat convection transfer between inner surfaces of the bladder, as well as any radiant heat transfer between surfaces. Various types of thermal insulation could be employed within the inflatable bladder.

Advantageously, by cooling the electronic module improved performance is achieved, particularly for CMOS-based integrated circuit chips. Condensation due to attaching a cold plate to the module surface is eliminated by inflating the bladder to conformally engage all cooled surfaces of the module to prevent air from contacting the module, thereby preventing a shortening of the life of the electronic module, as well as any printed circuit board to which it is attached, thus ensuring module and board reliability.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

BEST MODE FOR CARRYING OUT THE INVENTION

As briefly noted above, processor performance can be improved by significantly reducing chip operating temperatures. As the chip junction temperature drops so does the temperature of the outer surface of the electronic module. Depending upon how low the chip temperature drops, the temperature of the pins connecting the module to the board will also drop, as well as the board temperature in the vicinity of the electronic module. Eventually the outside surface temperature of the module, pins, and surrounding board surface will drop below the ambient dew point temperature, and water from the surrounding air will begin to condense on these "cold" surfaces. The presence of liquid water on or in close proximity to pin and board surfaces carrying electrical current is obviously undesirable.

Thus, proposed herein is a thermally insulating, vapor-proof sealing system which prevents moisture-laden air (i.e., water vapor) from contacting cold surfaces of an electronic device, while also providing thermal insulation so that temperatures of the resultant surfaces the air does contact are maintained above the dew point, and so that the parasitic heat load on the cooling system is reduced.

In one embodiment, the sealing system of the present invention includes an inflatable, flexible bladder which is preconfigured to at least partially surround an electronic device. Thermal insulation is optionally disposed within the flexible bladder to inhibit heat transfer by convection or radiation therein. A retention cover or frame holds the bladder in position against one or more surfaces of the electronic device. Depending upon the configuration of the electronic device, multiple inflatable bladders and retention covers can be employed. Again, the goal of the inflatable bladder is to closely conform to one or more cooled surfaces of an electronic device to prevent ambient air from contacting those surfaces, and thereby prevent water vapor from condensing on those surfaces. Depending upon the extent of cooling, various types of thermal insulation (described below) can be disposed within the inflatable bladder.

Figure 1:
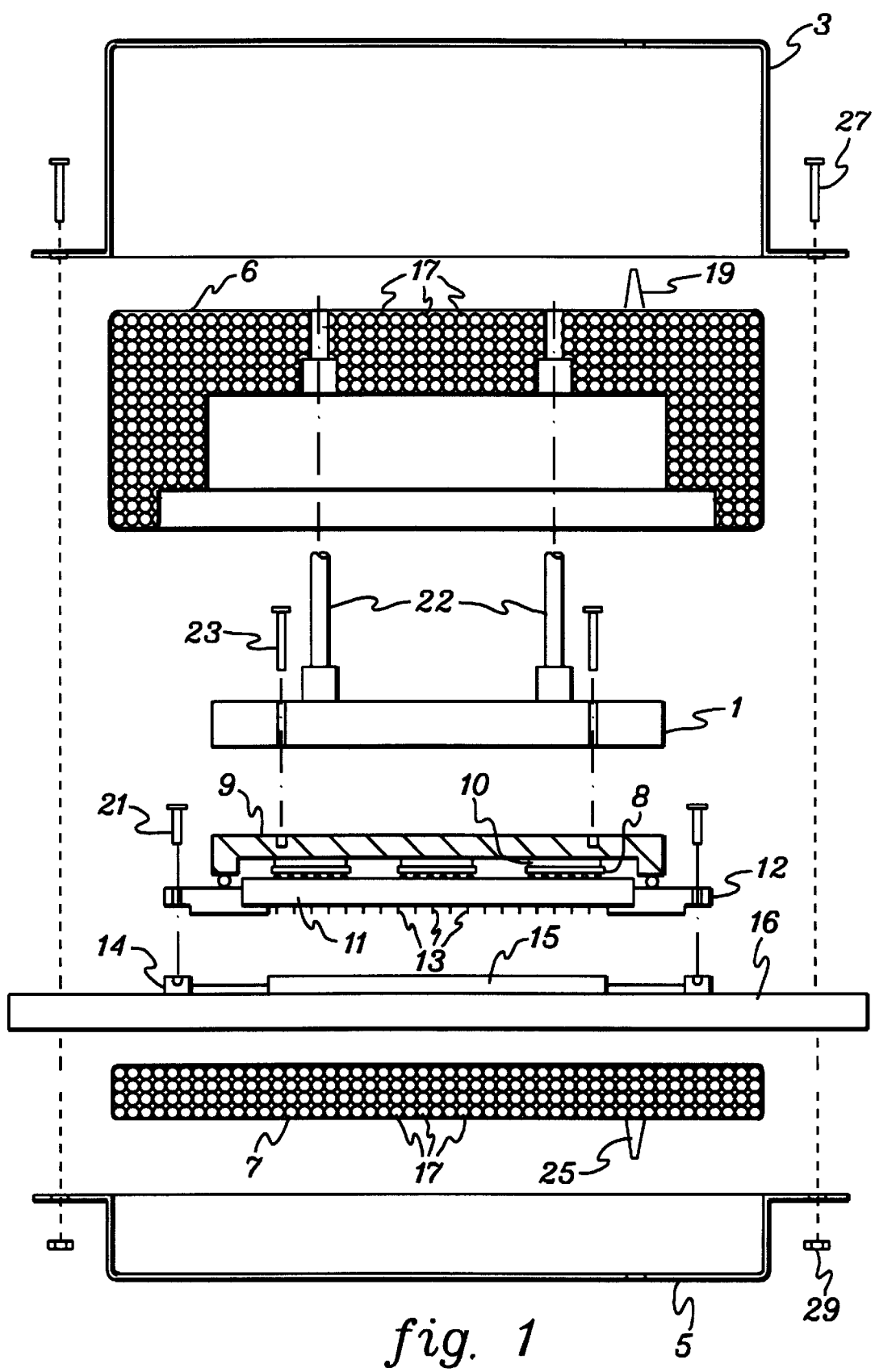
FIG. 1 is an exploded elevational view of one embodiment of an electronic device assembly in accordance with the principles of the present invention, wherein the electronic device assembly comprises an electronic module, a cold plate, and a sealing system, all of which couple to a printed circuit board.

FIG. 1 depicts one detailed embodiment of an electronic device assembly in accordance with the principles of the present invention.

Elements 8, 9, 10, 11, 12, and 13 together form an electronic processor module assembly which it is desirable to maintain at low temperature with the object of improving circuit speed performance and reliability. As noted, the electronic module could alternatively comprise a single entity. High performance integrated circuit chips 8 are attached to a glass/metal substrate 11 by means of electrically interconnecting solder pads (not labeled). A thermal path for heat flow from the chips is provided to the metal cap 9 by means of thermally conductive paste pads 10 in physical contact with the back of the chips 8 and the inner wall of the cap 9. The substrate 11 is mechanically captivated between a baseplate 12 and the side walls of the cap 9. A seal (not labeled) is provided between the top of the baseplate 12 and the perimeter walls of the cap 9 to isolate the chips 8 and associated top surface metallurgy from the exterior environment.

The module assembly is plugged into an electrical connector 15 joined to the printed circuit board 16. Paths for transfer of electrical signals and power between the printed circuit board 16 and connector 15 to the module substrate 11 are provided by means of electrically conductive pins 13 joined to the bottom of the substrate 11. A metal stiffener 14 is attached to the printed circuit board 16 to provide the requisite degree of structural rigidity and to provide the means of locking the module into position via mechanical bolts 21 arranged uniformly around the perimeter of the baseplate 12. A cold plate 1 is attached to the top surface of the module cap 9 by means of mechanical bolts 23 for the purpose of cooling the electronic module. Fluid transfer hoses 22 are attached to the cold plate 1 to provide entry and exit of cooling fluid.

The cooling fluid flowing through the cold plate may be water or other suitable liquid coolant. For operation below the freezing point of water a suitable antifreeze solution may be added to the water. The cold plate may also be operated as the evaporator of a refrigeration cooling system by passing a refrigerant through the cold plate and allowing it to boil.

Packages such as that already described are used today in IBM servers and in some cases are cooled by a refrigeration cooling system as discussed in the preceding paragraph. However, it is important to note that it has been necessary to operate the electronic module at a temperature above the room dew point to ensure that no water vapor will condense on the exposed cap 9, substrate 11, baseplate 12, pin 13, connector 15, stiffener 14, and printed circuit board 16 surfaces. As the temperatures of the chips 8 are lowered below the dew point to obtain improved circuit performance, the aforementioned exposed surfaces will all become cooler due to heat conduction to the "cold" chips 8, cap 9, and cold plate 1, and they will experience "sweating" or condensation of water vapor.

Figure 2:
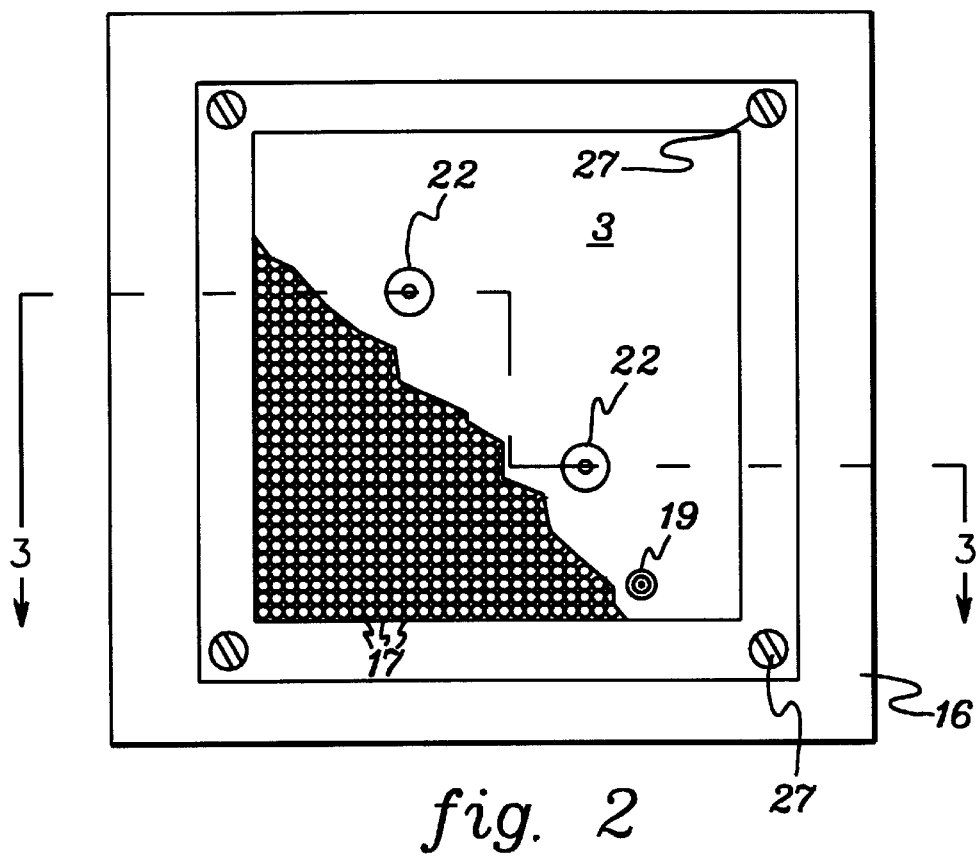
FIG. 2 is a plan view of another embodiment of an electronic device assembly in accordance with the principles of the present invention, wherein a sealing system includes an inflatable bladder having a plurality of hollow spheres disposed therein and a retention cover for facilitating conforming of the inflatable bladder to the electronic device.
Figure 3:
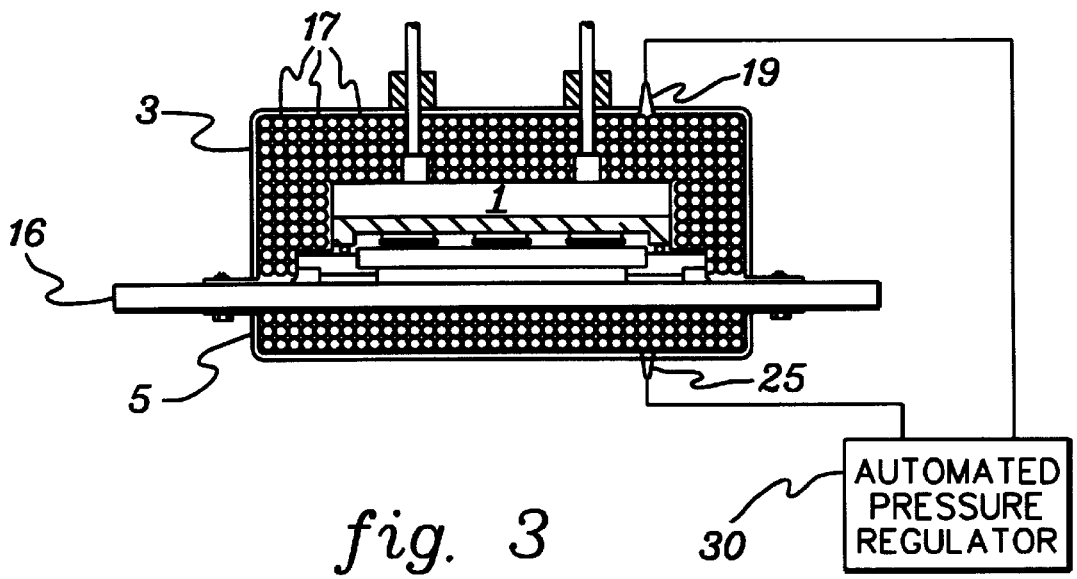
FIG. 3 is an elevational view illustrating the electronic device assembly of FIG. 2 taken along lines 3—3.

As shown in the embodiments of FIGS. 1, 2 & 3, a thermally insulating, vapor-proof sealing system in accordance with the principles of the present invention includes one or more flexible, inflatable (or pressurized) bladders 6, 7 each with its own bladder retention cover 3, 5. Bladder 6 is slipped over the cold plate and electronics module to be operated at sub-ambient temperatures. Bladder 6 is conformal and formed so that openings exist for coolant hoses 22 to pass through to the outside. In the depicted examples, bladder 7 is mounted on the opposite side of the printed circuit board 16. Each bladder is captivated by its own bladder retention cover 3 & 5. In the embodiments depicted in the figures, attachment of bladder retention covers 3 & 5 is by connecting bolts 27 and nuts 29 through board 16. Various alternate techniques for securing a retention cover to an electronic device will be apparent to those skilled in the art. For example, if a stiffening structure is employed on the printed circuit board, then the retention cover(s) could be bolted to the stiffener structure, rather than the printed circuit board.

Once the bladders are in place and the covers attached, the bladders can be inflated to an appropriate pressure using needle valves 19 & 25 shown on bladders 6 & 7, respectively. A simple air pump could be used to inflate the bladders. As the bladders are inflated, they will press against and further conform to adjacent surfaces of the electronic device causing an airtight seal, and thereby prevent the ingress of moist air. Although the sealing action could be obtained with bladders simply filled with air at the appropriate pressure to achieve conformity with the surface, it is believed preferable to inflate the bladders after positioning the bladders against the electronic device with the retention covers secured over the bladders.

Depending upon the extent of cooling, natural convection currents or cells might arise within the bladders, thereby reducing their effectiveness as a thermal insulating blanket. Thus, thermal insulation 17 is provided within the bladders as desired. Thermal insulation 17 can be made of a variety of materials and/or structures. Structurally, insulation falls into two general categories: evacuated (vacuum) or unevacuated. Evacuated insulations are more difficult (i.e., costly) to implement and are typically reserved for systems at very low temperatures (77k and below). From a material standpoint, insulations can be made out of powders, fibers, foams, cork, etc. More particularly, glass wool, fiberglass, hollow spheres (such as glass beads) and powders are all possible thermal insulation material for use within the bladders.

The flexible bladder can comprise any flexible membrane, such as rubber, that is capable of being formed to closely match one or more contours of the electronic device. The bladder, which again conforms to one or more surfaces of the electronic device, closely matches the contours of the one or more surfaces to be protected once positioned between the retention cover and the electronic device and inflated. The bladder's characteristics preferably include: 1) low permeability to gases, air, and moisture; 2) high resistance to degradation due to ozone or oxidation; 3) low modulus of elasticity (e.g., 50–500 psi); and 4) high elongation (e.g., 300–800%). One example of an acceptable bladder material would be isobutylene isoprene rubber.

Long term reliability is paramount in computer applications. For example, it is desirable to ensure operability for up to 10 years or more in high-end server applications. Over this length of time, air might escape through the valving mechanism or permeate through the bladder walls. Notwithstanding this, it is desirable that the inflatable bladder maintain its operating pressure level through the life of the product.

Gas permeability can be mitigated by coating the inside and outside bladder walls with mylar. This alone may be sufficient for shorter product lives, but is unlikely to last for 10+ years. Thus, in an enhanced embodiment of the present invention a form of active pressure control is desirable. FIG. 3 illustrates one embodiment wherein an automated pressure regulator 30, for example, comprising a pressure source and a pressure regulator valve, is connected to the needle valves of the bladders surrounding the electronic device. The regulator valve within the automated regulator senses pressure on the downstream side of the valve, which is also the bladder pressure level. If this pressure drops below a predetermined (low-level) set point, the valve opens allowing air from the high pressure storage vessel to enter the bladder(s). The pressure level within the bladder(s) rises as air enters from the vessel. The regulator valve would then shut when the downstream pressure rises to a high-level set point.

An alternate approach to ensuring bladder pressure level would be to use a compressor in tandem with a pressure switch. The compressor would serve the function of the high pressure storage vessel and the pressure switch would serve the function of the pressure regulator valve. When pressure within the bladder(s) drops below a low-level set point, the switch, through the appropriate electrical circuitry, would activate the compressor. The compressor then raises the pressure level within the bladder until reaching a high-level set point of the switch, at which point the compressor is deactivated.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A sealing system for an electronic device, said sealing system comprising:
   a flexible bladder configured to seal air from reaching a surface of said electronic device and thereby prevent condensation from forming thereon;
   at least one thermal insulation structure disposed within and at least partially filling said flexible bladder to inhibit heat transfer therethrough by convection; and
   a retention cover configured to hold said flexible bladder against said electronic device.

2. The sealing system of claim 1, wherein said flexible bladder comprises an inflatable bladder, said inflatable bladder including a valve to facilitate inflating of said bladder, wherein inflating of said flexible bladder forces said flexible bladder against said electronic device, thereby facilitating conforming of said flexible bladder to said electronic device.

3. The sealing system of claim 2, wherein said at least one thermal insulation structure further inhibits heat transfer by radiation within said flexible bladder.

4. The sealing system of claim 1, wherein said at least one thermal insulation structure further inhibits heat transfer by radiation within said flexible bladder.

5. The sealing system of claim 1, further in combination with an electronic device, said electronic device comprising an electronic module having a cold plate coupled thereto, and wherein said flexible bladder is configured to seal a surface of said cold plate.

6. The sealing system of claim 1, further in combination with an electronic device, said electronic device comprising a multichip module residing on a printed circuit board, and wherein said flexible bladder comprises a first flexible bladder and said retention cover comprises a first retention cover, said first flexible bladder being configured to seal a surface of said multichip module and said retention cover engaging said first flexible bladder for holding said first flexible bladder against said multichip module, and wherein said sealing system further comprises a second flexible bladder configured to seal a surface of said printed circuit board and a second retention cover engaging said second flexible bladder for holding said second flexible bladder against said printed circuit board, and wherein at least one of said first flexible bladder and said second flexible bladder includes said at least one thermal insulation structure.

7. The combination system of claim 6, wherein said first flexible bladder and said second flexible bladder each comprise an inflatable bladder, wherein inflating of said first flexible bladder and said second flexible bladder forces said first and second flexible bladders against said multichip module and said printed circuit board, respectively, thereby facilitating conforming of said first flexible bladder and said second flexible bladder to said multichip module and said printed circuit board.

8. The combination system and assembly of claim 7, wherein said first flexible bladder prevents air from contacting said surface of said multichip module and said second flexible bladder prevents air from contacting said surface of said printed circuit board, thereby preventing condensation from forming on said surface of said multichip module and said surface of said printed circuit board.

9. The sealing system of claim 1, wherein said flexible bladder comprises an inflatable bladder, and wherein said sealing system further comprises an automated pressure regulator coupled to said flexible bladder for automatically maintaining said flexible bladder inflated.

10. A sealing system for an electronic device, said sealing system comprising:
- a flexible bladder configured to seal a surface of said electronic device;
- thermal insulation disposed within said flexible bladder;
- a retention cover configured to hold said flexible bladder against said electronic device;
- wherein said flexible bladder comprises an inflatable bladder, said inflatable bladder including a valve to facilitate inflating of said bladder, wherein inflating of said flexible bladder forces said flexible bladder against said electronic device, thereby facilitating conforming of said flexible bladder to said electronic device;
- wherein said thermal insulation inhibits heat transfer by convection and radiation within said flexible bladder; and
- wherein said thermal insulation comprises a plurality of thermally insulating spheres disposed within said flexible bladder.

11. The sealing system of claim 10, wherein said plurality of thermally insulating spheres comprises a plurality of thermally insulating hollow spheres.

12. A sealing system for an electronic device, said sealing system comprising:
- a flexible bladder configured to seal a surface of said electronic device;
- thermal insulation disposed within said flexible bladder;
- a retention cover for holding said flexible bladder against said electronic device;
- wherein said thermal insulation inhibits heat transfer by convection and radiation within said flexible bladder; and
- wherein said thermal insulation comprises a plurality of thermally insulating spheres disposed within said flexible bladder.

13. The sealing system of claim 12, wherein said plurality of thermally insulating spheres comprises a plurality of thermally insulating hollow spheres.

14. A combination sealing system and electronic device assembly comprising:
- a flexible bladder configured to seal a surface of said electronic device assembly;
- thermal insulation disposed within said flexible bladder;
- a retention cover for holding said flexible bladder against said electronic device assembly;
- wherein said electronic device assembly comprises a multichip module residing on a printed circuit board, and wherein said flexible bladder comprises a first flexible bladder and said retention cover comprises a first retention cover, said first flexible bladder being configured to seal a surface of said multichip module and said retention cover engaging said first flexible bladder for holding said first flexible bladder against said multichip module, and wherein said sealing system further comprises a second flexible bladder sealing a surface of said printed circuit board and a second retention cover for holding said second flexible bladder against said printed circuit board, and wherein at least one of said first flexible bladder and said second flexible bladder includes said thermal insulation;
- wherein said first flexible bladder and said second flexible bladder each comprise an inflatable bladder, wherein inflating of said first flexible bladder and said second flexible bladder forces said first and second flexible bladders against said multichip module and said printed circuit board, respectively, thereby facilitating conforming of said first flexible bladder and said second flexible bladder to said multichip module and said printed circuit board; and
- wherein said thermal insulation resides within each of said first flexible bladder and said second flexible bladder, and wherein said thermal insulation inhibits heat transfer by convection and radiation within said flexible bladders.

15. The combination system and assembly of claim 14, wherein said thermal insulation comprises a plurality of low thermal conductivity spheres disposed within each of said first flexible bladder and said second flexible bladder.

16. The combination system and assembly of claim 15, wherein said plurality of low thermal conductivity spheres within each of said first flexible bladder and said second flexible bladder comprises a plurality of low thermal conductivity hollow spheres.

17. A combination sealing system and electronic device assembly comprising:
- a flexible bladder configured to seal a surface of said electronic device assembly;
- thermal insulation disposed within said flexible bladder;
- a retention cover for holding said flexible bladder against said electronic device;
- wherein said electronic device assembly comprises a multichip module residing on a printed circuit board, and wherein said flexible bladder comprises a first flexible bladder and said retention cover comprises a first retention cover, said first flexible bladder being configured to seal a surface of said multichip module and said retention cover engaging said first flexible bladder for holding said first flexible bladder against said multichip module, and wherein said sealing system further comprises a second flexible bladder configured to seal a surface of said printed circuit board and a second retention cover for holding said second flexible bladder against said printed circuit board, and wherein at least one of said first flexible bladder and said second flexible bladder includes said thermal insulation;
- wherein said first flexible bladder and said second flexible bladder each comprise an inflatable bladder, wherein inflating of said first flexible bladder and said second flexible bladder forces said first and second flexible bladders against said multichip module and said printed circuit board, respectively, thereby facilitating conforming of said first flexible bladder and said second flexible bladder to said multichip module and said printed circuit board; and
- further comprising an automated pressure regulator coupled to said first flexible bladder and to said second flexible bladder for automatically maintaining said first flexible bladder and said second flexible bladder inflated.

18. An electronic device assembly comprising:
- a cooled electronic device;
- a sealing system for said cooled electronic device, said sealing system comprising:
  - a flexible bladder configured to seal a surface of said electronic device to prevent air from reaching said surface and thereby prevent condensation from forming thereon;
  - thermal insulation disposed within and at least partially filling said flexible bladder to inhibit heat transfer therethrough by convection; and a retention cover holding said flexible bladder against said electronic device.

19. The electronic device assembly of claim 18, wherein said flexible bladder comprises at least one of an inflatable bladder or a pressurized bladder, said bladder being configured to conformally engage multiple surfaces of the cooled electronic device to inhibit air from reaching said multiple surfaces and thereby inhibit condensation from forming thereon.

20. An electronic device assembly comprising:
   an electronic module;
   a cold plate thermally coupled to a planar main surface of the electronic module; and
   at least one of an inflatable bladder or a pressurized bladder configured to conformally overlay multiple surfaces of the electronic module and cold plate to prevent air from reaching said multiple surfaces and thereby prevent condensation from forming thereon.

21. The electronic device assembly of claim 20, further comprising thermal insulation disposed within said inflatable bladder or pressurized bladder, said thermal insulation inhibiting heat transfer by convection and radiation within said bladder.

22. The electronic device assembly of claim 21, wherein said thermal insulation comprises a plurality of thermally insulating spheres disposed within said flexible bladder.

23. The electronic device assembly of claim 20, further comprising a retention cover holding said bladder against said multiple surfaces.

24. The electronic device assembly of claim 20, wherein said bladder comprises said inflatable bladder, and wherein said electronic device assembly further comprises an automated pressure regulator coupled to said inflatable bladder for automatically maintaining said flexible bladder inflated.

25. A method for fabricating an electronic device assembly, said method comprising:
   providing an electronic module;
   providing a flexible bladder configured to seal a surface of said electronic module to prevent air from reaching said surface and thereby prevent condensation from forming thereon, said flexible bladder having thermal insulation disposed therein and at least partially filling said bladder to inhibit heat transfer therethrough by convection; and
   applying a retention cover to said flexible bladder and electronic module to hold said flexible bladder against said electronic module.

26. The method of claim 25, wherein said flexible bladder comprises an inflatable bladder, and wherein said method further comprises inflating said flexible bladder to facilitate said flexible bladder conformally engaging multiple surfaces of said electronic module, thereby preventing condensation from forming on said multiple surfaces of said electronic module.

27. The method of claim 26, wherein said inflating comprises monitoring pressure within said flexible bladder, and responsive thereto, automatically inflating said flexible bladder to maintain said pressure above a predetermined set point.

28. The method of claim 25, wherein said providing of said flexible bladder comprises providing said flexible bladder with a configuration to conformally engage multiple surfaces of said electronic module.

29. A method for fabricating an electronic device assembly, said method comprising:
   providing an electronic module;
   providing a flexible bladder configured to seal at least one surface of said electronic module, said flexible bladder having thermal insulation disposed therein; and
   applying a retention cover to said flexible bladder and electronic module for holding said flexible bladder against said electronic module;
   wherein said flexible bladder comprises an inflatable bladder, and wherein said method further comprises inflating said flexible bladder to facilitate said flexible bladder conformally engaging multiple surfaces of said electronic module, thereby preventing condensation from forming on said multiple surfaces of said electronic module; and
   wherein said thermal insulation comprises a plurality of thermally insulating spheres.

30. A method for fabricating an electronic device assembly, said method comprising:
   providing an electronic module;
   providing a cold plate and thermally coupling said cold plate to a planar main surface of said electronic module; and
   providing at least one of an inflatable bladder or a pressurized bladder configured to seal multiple surfaces of the electronic module and cold plate to prevent air from reaching said multiple surfaces and thereby prevent condensation from forming thereon.

31. The method of claim 30, further comprising applying a retention cover over said at least one inflatable bladder or pressurized bladder for holding said bladder against said multiple surfaces.

32. The method of claim 30, wherein said bladder comprises said inflatable bladder, and wherein said method comprises inflating said inflatable bladder to inhibit air from reaching said multiple surfaces and thereby inhibit condensation from forming thereon.

33. The method of claim 32, wherein said inflating comprises monitoring pressure within said flexible bladder, and responsive thereto, automatically inflating said flexible bladder to maintain said pressure above a predetermined set point.

* * * * *